(12) United States Patent
Huang et al.

(10) Patent No.: US 8,900,986 B2
(45) Date of Patent: Dec. 2, 2014

(54) METHOD TO REALIZE FLUX FREE INDIUM BUMPING

(75) Inventors: Qiuping Huang, Shanghai (CN); Le Luo, Shanghai (CN); Gaowei Xu, Shanghai (CN); Yuan Yuan, Shanghai (CN)

(73) Assignee: Shanghai Institute of Microsystem and Information Technology, Chinese Academy of Sciences, Shanghai (CN)

( * ) Notice: Subject to any disclaimer, the term of this patent is extended or adjusted under 35 U.S.C. 154(b) by 0 days.

(21) Appl. No.: 13/880,451

(22) PCT Filed: Oct. 21, 2011

(86) PCT No.: PCT/CN2011/081091
§ 371 (c)(1),
(2), (4) Date: Jun. 13, 2013

(87) PCT Pub. No.: WO2012/051960
PCT Pub. Date: Apr. 26, 2012

(65) Prior Publication Data
US 2013/0273730 A1 Oct. 17, 2013

(30) Foreign Application Priority Data
Oct. 22, 2010 (CN) .......................... 2010 1 0515444

(51) Int. Cl.
*H01L 21/00* (2006.01)
*H01L 23/00* (2006.01)
(Continued)

(52) U.S. Cl.
CPC *H01L 24/11* (2013.01); *C25D 5/10* (2013.01); *C25D 5/50* (2013.01); *H01L 24/03* (2013.01);
(Continued)

(58) Field of Classification Search
None
See application file for complete search history.

(56) References Cited

U.S. PATENT DOCUMENTS 8,546,930 B2 * 10/2013 Bakir et al. .................. 257/686
8,629,564 B2 * 1/2014 Katsurayama et al. ....... 257/777
(Continued)

FOREIGN PATENT DOCUMENTS

CN 1855462 A 11/2006
CN 1964915 A 5/2007
CN 102064120 A 5/2011

OTHER PUBLICATIONS

International Search Report, Feb. 16, 2012.

*Primary Examiner* — Charles Garber
*Assistant Examiner* — Evren Seven
(74) *Attorney, Agent, or Firm* — Dickinson Wright PLLC

(57) ABSTRACT

A method to realize flux free indium bumping process includes several steps including substrate metallization, contact holes opening, underbump metallization (UBM) layer thickening, indium bump preparation and Ag layer coating. The method can be used in the occasion for some special application, e.g., the packaging of the photoelectric chip (with optical lens), MEMS and biological detection chip, where the usage of flux is prohibited.

12 Claims, 1 Drawing Sheet

(51) Int. Cl.
*C25D 5/10* (2006.01)
*C25D 5/50* (2006.01)
*C25D 5/02* (2006.01)
*C25D 3/46* (2006.01)
*C25D 3/54* (2006.01)

(52) U.S. Cl.
CPC ............... H01L 24/05 (2013.01); H01L 24/13 (2013.01); C25D 5/02 (2013.01); *C25D 3/46* (2013.01); *C25D 3/54* (2013.01); *H01L 2224/0345* (2013.01); *H01L 2224/03462* (2013.01); *H01L 2224/0347* (2013.01); *H01L 2224/03849* (2013.01); *H01L 2224/05082* (2013.01); *H01L 2224/05147* (2013.01); *H01L 2224/05166* (2013.01); *H01L 2224/05666* (2013.01); *H01L 2224/11462* (2013.01); *H01L 2224/11825* (2013.01); *H01L 2224/13099* (2013.01); *H01L 2224/13109* (2013.01); *H01L 2224/13562* (2013.01); *H01L 2224/13639* (2013.01); *H01L 2924/01029* (2013.01); *H01L 2924/01033* (2013.01); *H01L 2924/01047* (2013.01); *H01L 2924/01049* (2013.01); *H01L 2924/01079* (2013.01); *H01L 2924/01082* (2013.01); *H01L 2924/014* (2013.01); *H01L 2924/01005* (2013.01); *H01L 2924/01006* (2013.01); *H01L 2924/0105* (2013.01); *H01L 2924/01074* (2013.01); *H01L 2924/01322* (2013.01); *H01L 24/94* (2013.01); *H01L 2224/05083* (2013.01); *H01L 2224/11849* (2013.01); *H01L 2224/94* (2013.01)
USPC ..................... 438/613; 438/106; 438/612

(56) References Cited

U.S. PATENT DOCUMENTS

| | | | |
|---|---|---|---|
| 2004/0140219 A1* | 7/2004 | Bojkov et al. | 205/102 |
| 2004/0238602 A1* | 12/2004 | Furuno et al. | 228/180.22 |
| 2005/0009315 A1 | 1/2005 | Kim et al. | |
| 2010/0165585 A1* | 7/2010 | Lin et al. | 361/748 |
| 2013/0037603 A1* | 2/2013 | Choi et al. | 228/203 |

* cited by examiner

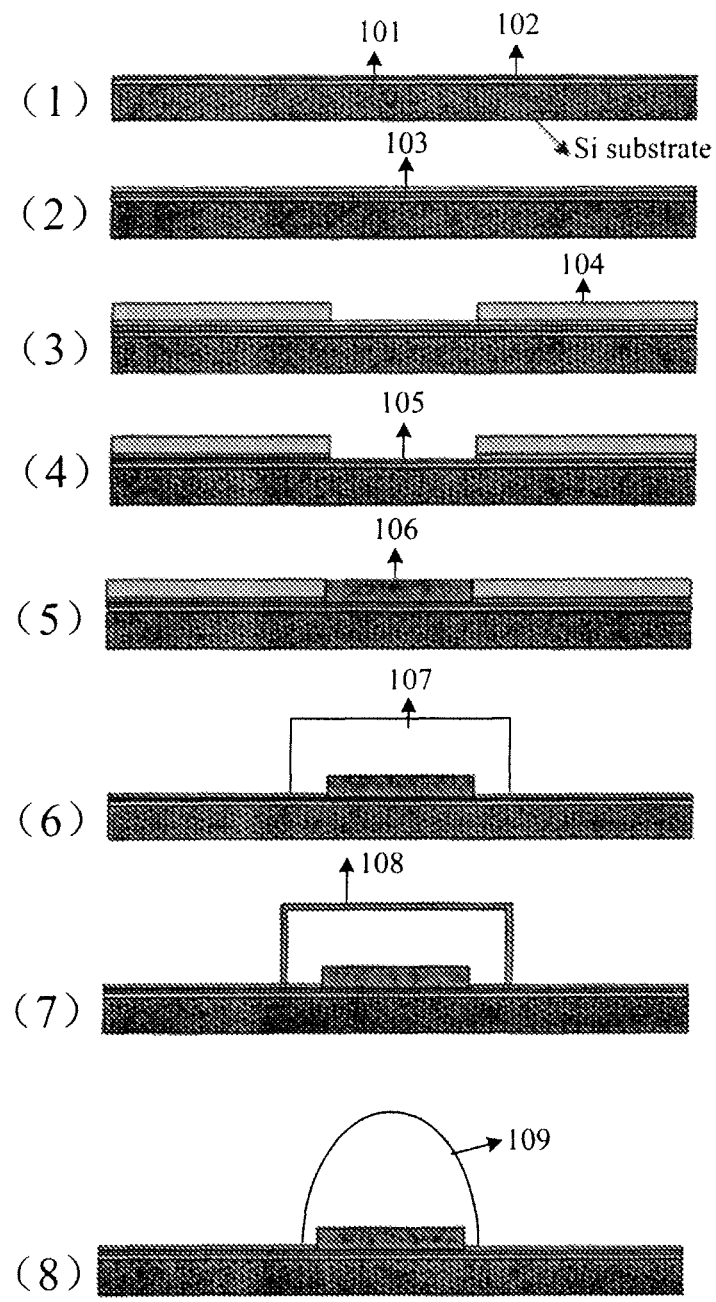

METHOD TO REALIZE FLUX FREE INDIUM BUMPING

CROSS-REFERENCE TO RELATED APPLICATION

This U.S. National Stage Patent Application claims the benefit of International Application serial number PCT/CN2011/081091 filed on Oct. 22, 2010, the entire disclosure of the application being considered part of the disclosure of this application, and hereby incorporated by reference.

BACKGROUND OF THE INVENTION

1. Field of the Invention

In this invention a method to realize fluxless indium bumping is described. This method can be used for the packaging for MEMS, photoelectric chip, bio-chip and so on. It is an invention in the field of microelectronics packaging.

2. Prior Art

Solder is a must for microelectronics packaging. Normally it can help to realize the signal transmission and provide mechanical support in and between chips. For a normal packaging process, flux is also a must. For example, when using Sn solder to weld chips without flux, it will be very difficult to get a high quality interconnect due to the oxidized surface. Such oxidized surface will prevent alloy formation when welding because it has a very high melting point. In order to get a high-quality interconnection, flux must be used for remove the oxide layer. But for some application, such as the packaging of the photoelectric chip (with optical lens), MEMS and biological detection chip, flux is prohibited to avoid its pollution to chip. The pollution probably causes device performance degradation and even completely failure. So it is necessary to develop a kind of flux free welding process for such applications. Normally two ways can be used to realize such kind of welding. One is with special flux such as hydrogen plasma, which can provide a strong educability environment; the other is to coat a special thin layer on the solder surface which can prevent the solder being oxidized. The second way is described in this invention.

The most difficult point for this technology is how to realize flux free solder bumping. So far two research groups have some studies on this technology deduced from the published paper. First one is Chin C. Lee's group, who succeeded to realize two chips welding with Tin-based solder and without flux [Chin C. Lee, Ricky W. Chuang. Fluxless Non-Eutectic Joints Fabricated Using Gold-Tin Multilayer Composite. IEEE Transactions On Components And Packaging Technologies, 2003, 26(2):252-263]; the other is Jeong-Won Yoon's group, who realized Tin-based solder bumping without flux[Jeong-Won Yoon, Hyun-Suk Chun, Seung-Boo Jung. Reliability evaluation of Au-20Sn flip chip solder bump fabricated by sequential electroplating method with Sn and Au. Materials Science and Engineering A, 2008, 473:119-125.]. In this invention, a method is proposed to achieve flux free indium-based bumping. As it is known, indium is a kind of metal with many excellent properties, such as low melting point, excellent plasticity, excellent welding characteristics in low temperature and so on. These properties are better than that of Tin-based solder.

SUMMARY OF THE INVENTION

To realize flux free indium bumping, a layer is introduced onto its surface with electroplating, what can protect indium from being oxidized. As it is known, the normally used metal for anti-oxidation layer is golden or silver. But when introducing Au onto indium solder surface, Au—In alloy on the indium solder surface will prevent indium bumping due to its high melting point what can be deduced from Au—In phase diagram. When introducing Ag onto the indium surface, the issue described above will not appear. From the Ag—In phase diagram, the melting point of In—Ag alloy will drop firstly, and to the lowest melting point (144° C.) when the In/Ag mass ratio is about 24 and then increase slowly when the Ag content increasing. To solder for welding, the melting point of 144° C. is quite low. So by introducing Ag onto the surface of indium solder, it can prevent indium from being oxidized and also kept the reflow temperature at a low level.

Ag coating on indium solder is the key point in this invention. In order to clarify this invention, a detailed process flow is described as an example;

The process flow is showed as following.

A. Si substrate metallization (a) Substrate plane preparation: $SiO_2$ is grown on the Si wafer by thermal oxidation;

(b) Ti/Cu/Ti is sputtered on oxidation Si wafer with method of magnetron sputtering. Ti under Cu is as adhesion layer to $SiO_2$, Ti on Cu layer protects Cu from being oxidized and also can provide excellent adhesion to the sputtered oxide layer. Ti/Cu/Ti here is used as underbump metallization (UMB) layer and also seed layer;

B. Contact holes opening (a) $SiO_2$ passivation layer is deposited on Ti/Cu/Ti with PECVD (plasma-enhanced chemical vapor) method;

(b) Define pattern on the wafer with lithography process: Firstly, to coat 1-3 um positive photography on the wafer and finish photography process; secondly to remove photoresist at the wafer edge; thirdly, to remove $SiO_2$ layer on the pattern to get contact holes with $CF_4$ plasma or BOE (buffer oxide etch); The diameter of contact hole here is about 30 um-50 um;

C. Underbump metallization (UBM) thickening (a) Cu layer thickening with electroplating. Normally the thickness for sputtered Cu layer is from 1000 Å to 5000 Å. If using Cu layer with such thickness as UBM, the solder bump will easily fall off when reflow. 2-4 um Cu layer here is preferred.

D. Indium electroplating on Cu UBM layer (a) Remove photoresist by immersing wafer into hot acetone after Cu layer thickening;

(b) Indium electroplating on Ti/Cu see layer. To avoid the electroplated indium being oxidizing, it shouldn't be exposed into air before the Ag coating. The acetone can provide such protection.

E. Ag layer coating on indium surface with electroplating.

(a) Ag—In alloy will form on indium solder surface. This alloy layer will prevent indium from being oxidized;

F. Ag-coated indium solder bumping.

(a) The reflow process is carried in an annealing furnace with $H_2$ or $N_2$ atmosphere. The time is about 3 min-8 min at a summit temperature of 180° C.-220° C.;

Chip dicing;

From the process described above, a method is proposed to achieve flux free indium-based bumping in this invention. The advantages of this invention lies in the fact that: bumping process is with indium-based solder, which is a solder with low melting point, excellent plasticity, excellent welding property; The indium solder and the Ag coating layer can be easily prepared with step by step electroplating; The In—Ag solder can be reflowed at low temperature (~200° C.). In all, this invention provides a way to the packaging of the photoelectric chip (with optical lens), MEMS, biological detection chip and so on.

The character of the invention is as following:

(1) The indium-based bump is prepared with electroplating step by step after substrate metallization and contact hole opening;

Using sputtered Ti/Cu/Ti to realize substrate metallization;

Oxide passivation layer here is prepared with PECVD method; The contact hole is opened with BOE or $CF_4$ plasma etching;

A perfect Ag coating layer on indium surface is got with a controllable electroplating process;

Reflow process is carried in an annealing furnace with $H_2$ or $N_2$ atmosphere and the reflow chart can be controlled;

BRIEF DESCRIPTION OF THE DRAWINGS

The process for this invention is showed in FIG. 1. The details can be described as following:

DETAILED DESCRIPTION OF THE INVENTION

In order to clarify this invention, an example in detail can be described as following.

Step 1. Substrate plane preparation: 5000 Å $SiO_2$ layer 101 is grown on the Si wafer substrate by thermal oxidation, and then a layer 102 is sputtered on the $SiO_2$ layer. The Ti/Cu/Ti (200 Å/2000 Å/200 Å) used as underbump metallization (UMB) layer and also seed layer;

Step 2. Passivation layer preparation: A 5000 Å SiO2 layer 103 is prepared with plasma-enhanced chemical vapor deposition (PECVD) method;

Step 3. A 1.7 um positive photoresist (S1912) 104 is coated on the wafer and then finish photography process;

Step 4. Contact hole opening: $SiO_2$ and Ti on Cu layer are etched away with BOE (buffer-oxide-etch); 40 um Cu pattern 105 is exposed;

Step 5. Cu layer thickening: 2 um Cu 106 is prepared on sputtered Cu layer. After finishing Cu electroplating, photoresit is removed with acetone (the PR removal also can be carried in step 8 before the reflow process);

Step 6. Prepare indium bump with electroplating: A current of 5-20 mA/cm2 is preferred and the indium bump 107 is prepared; after finishing electroplating, the wafer is immersed into alcohol to prevent it from being oxidized;

Step 7. Ag layer 108 is coated onto the surface of indium solder. The thickness of Ag layer is controlled by electroplating condition; the mass ratio of In/Ag is controlled by the thickness of the Ag layer; the mass ratio of In/Ag should be near to 24, where is the In/Ag eutectic point;

Step 8. The indium bump is reflowed in a furnace with $H_2$ or $N_2$ atmosphere with summit temperature of 200° C. for 5 min. The final indium bump 109 can be got.

Wafer dicing.

What is claimed is:

1. A method for flux-free bumping using indium, comprising:

A. a first step of providing an under bump metallization (UBM) and seed layer on a silicon substrate, the first step comprising:

(a) growing a first oxide layer on the silicon substrate by thermal oxidation; and (b) depositing, in sequence, a first layer of titanium on the first oxide layer, a first layer of copper on the first layer of titanium, and second layer of titanium on the first layer of copper, the deposition performed by sputtering;

B. a second step of providing contact holes for contacting the UBM layer, the second step comprising:

(c) forming a second layer of oxide on the UBM layer by plasma enhanced chemical vapor deposition (PECVD);

(d) forming a layer of photoresist on the second layer of oxide;

(e) defining a pattern of contact holes in the photoresist layer by a lithography process;

(f) opening contact holes in the second oxide layer according to the pattern by etching the second oxide layer and the second layer of titanium with one of a CF4 plasma and buffer oxide etch (BOE);

C. a third step of electroplating a second layer of copper on the first layer of copper;

D. a fourth step of providing indium bumps on the UBM layer, the fourth step comprising:

(h) immersing the silicon substrate in a hot acetone thereby removing the photoresist layer;

(i) electroplating a layer of indium on the second layer of copper;

(j) electroplating a layer of silver on the layer of indium thereby providing an anti-oxidation layer on the indium layer, the mass ratio of the layer of indium to the layer of silver is close to the indium-silver eutectic point; and (k) reflowing the silver coated indium layer at a summit temperature of 180-220° C. in an annealing furnace in an atmosphere of H2 or N2, thereby forming indium solder bumps in the openings.

2. The method of claim 1 wherein the thickness of the first layer of titanium is 200 Å, the thickness of the first layer of copper is 2000 Å, the thickness of the second layer of titanium is 200 Å.

3. The method of claim 1 wherein the thickness of the layer of photoresist in step B (d) is about 1~3 μm.

4. The method of claim 1 wherein the diameter of the contact hole described in step B (f) is about 30 μm-50 μm.

5. The method of claim 1 wherein the thickness of the second layer of copper described in step C is about 2 μm-4 μm.

6. The method of claim 1 wherein the reflow process is carried out after finishing copper electroplating and photoresist removal.

7. The method of claim 1 wherein the current density for indium electroplating is about 5-20 mA/cm2.

8. The method of claim 1 wherein the reflow time at the summit temperature is about 3 min to 8 min.

9. The method of claim 1 wherein the summit temperature for reflow described in step D(k) is about 200° C.

10. The method of claim 8 wherein the reflow time is about 5 min at 200° C.

11. The method of claim 9 wherein the reflow time is about 5 min at 200° C.

12. The method of claim 1 wherein the mass ratio of the layer of indium to the layer of silver is close to 24.

\* \* \* \* \*